United States Patent [19]
Ebbers

[11] Patent Number: 5,945,037
[45] Date of Patent: Aug. 31, 1999

[54] OPTICAL POLARIZER MATERIAL

[75] Inventor: Christopher A. Ebbers, Livermore, Calif.

[73] Assignee: The Regents of the University of California, Oakland, Calif.

[21] Appl. No.: 08/611,154

[22] Filed: Mar. 5, 1996

[51] Int. Cl.[6] ............... F21V 9/14; G02B 5/30; C01D 7/00
[52] U.S. Cl. ............ 252/585; 252/584; 423/421; 359/485; 359/494
[58] Field of Search .................. 252/584, 585; 423/421; 359/485, 494

[56] References Cited

U.S. PATENT DOCUMENTS

| | | | |
|---|---|---|---|
| 3,112,171 | 11/1963 | Archambault | 423/421 |
| 3,914,018 | 10/1975 | DeShazer | 350/157 |
| 4,115,632 | 9/1978 | Kinoshita et al. | 423/421 |
| 4,207,297 | 6/1980 | Brown et al. | 423/421 |

OTHER PUBLICATIONS

Yatsenko et al., Materials Research Bulletin, vol. 30, No. 6, pp. 739–744, (1995).
Zhzhenykh et al., Chemical Abstracts 77:144379, Abstract of Tr. Irkutsk. Politek Inst., No. 66, pp. 26–36, (1971).
Christmann et al., Chemical Abstracts 90:64852, Abstract of Rev. Chim. Miner., vol. 15, No. 4, pp. 312–317, (1978).

Primary Examiner—Philip Tucker
Attorney, Agent, or Firm—John P. Wooldridge

[57] ABSTRACT

Several crystals have been identified which can be grown using standard single crystals growth techniques and which have a high birefringence. The identified crystals include $Li_2CO_3$, $LiNaCO_3$, $LiKCO_3$, $LiRbCO_3$ and $LiCsCO_3$. The condition of high birefringence leads to their application as optical polarizer materials. In one embodiment of the invention, the crystal has the chemical formula $LiK_{(1-w-x-y)}Na_{(1-w-x-z)}Rb_{(1-w-y-z)}Cs_{(1-x-y-z)}CO_3$, where $w+x+y+z=1$. In another embodiment, the crystalline material may be selected from a an alkali metal carbonate and a double salt of alkali metal carbonates, where the polarizer has a Wollaston configuration, a Glan-Thompson configuration or a Glan-Taylor configuration. A method of making an $LiNaCO_3$ optical polarizer is described. A similar method is shown for making an $LiKCO_3$ optical polarizer.

10 Claims, 1 Drawing Sheet

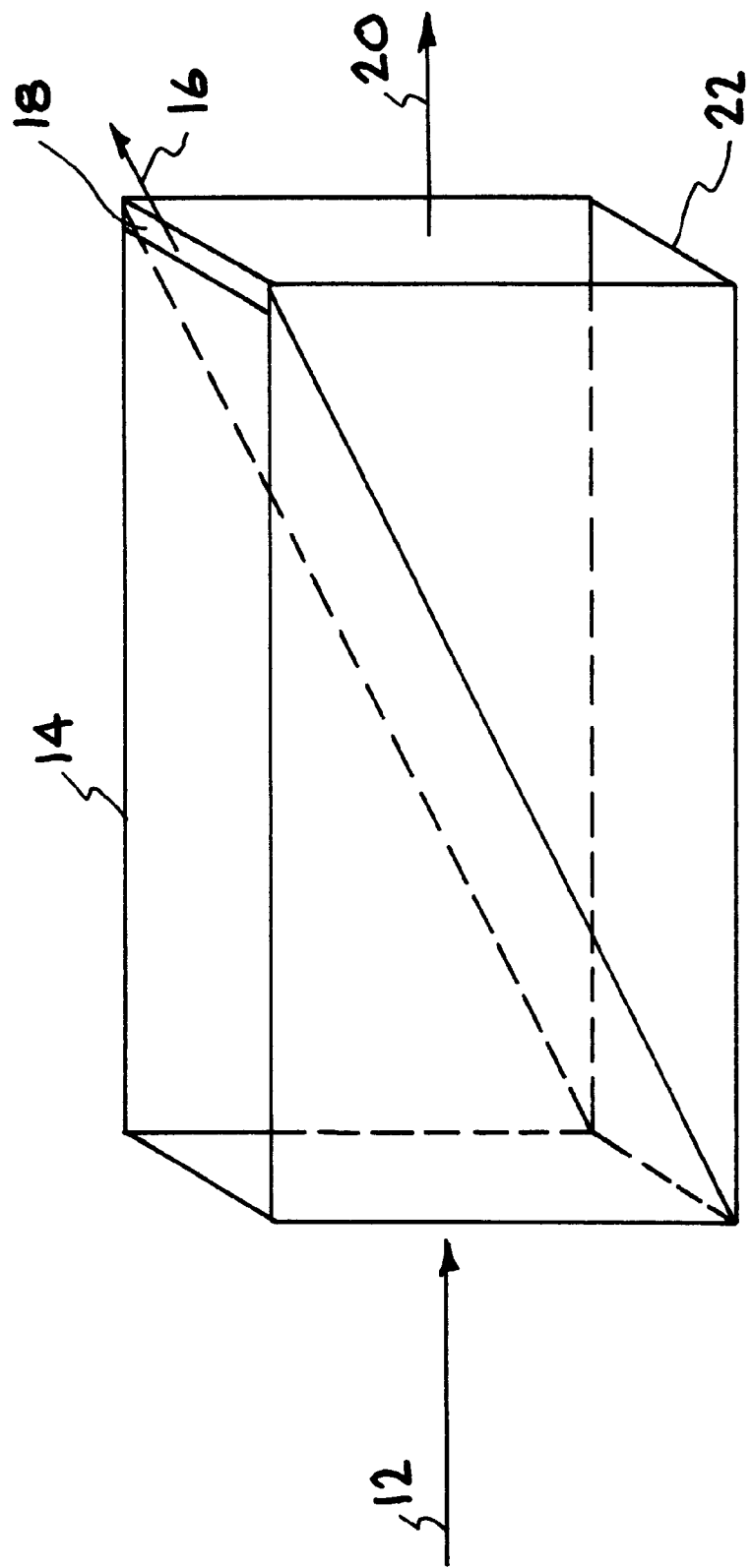

OPTICAL POLARIZER MATERIAL

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to optical polarizer materials and more specifically, it relates to double salts comprised from alkali metal carbonates which that have high birefringence and are useful as optical polarizers.

2. Description of Related Art

An electromagnetic wave (such as light from a laser) is characterized by its direction of propagation, frequency, amplitude and polarization. The polarization corresponds to the direction parallel to the plane (and normal to the propagation direction) in which the amplitude of the wave rises and falls. A polarizer acts to alter this direction, either by absorption or reflection of light waves with the incorrect polarization. Light from an incoherent source such as a light bulb consists of many super-imposed electro-magnetic waves with random, relative polarizations. Passing this light through a polarizer allows only those light waves with the desired polarization to pass through. An example of a polarizer of the first type (absorption) is Polaroid film found in many sunglasses. Polarizers of the second type (reflection) are formed using thin film dielectric coatings, parallel wire grids (used for wavelengths typically>than 1 micrometer) and birefringent crystals (predominantly calcite ($CaCO_3$)). Polarization altering components such as waveplates are almost exclusively made from quartz ($SiO_2$). Lasers which are high peak power (large energy per pulse/pulse width) or high average power (large energy per pulse multiplied by the pulses per second) risk damaging the Polaroid or wire grid polarizers. Lasers such as these must use the thin film polarizers or calcite polarizers.

Calcite polarizers are the "best" polarizers for a number of applications. The extinction ratio of a polarizer is a measure of how well that polarizer operates at to produce a specific polarization state of light. By placing together two similar polarizers with their polarization directions at right angles to each other, theoretically no light should be transmitted through those two polarizers. The ratio of the intensity of the measured transmitted light to the intensity of the incident light is known as the extinction ratio. Polaroid polarizers typically have an extinction ratio of 1:10,000. Thin film polarizers have typical extinction ratios of 1:1000. Calcite polarizers have the highest extinction ratios in the range of 1:100,000 to 1:1,000,000. Thin film polarizers are typically manufactured for a single wavelength, and thus are wavelength sensitive. Calcite polarizers have a higher extinction ratio, have a damage resistance as high as that of thin film polarizers, and are broadband. They are usable in the range of 2000 nm to 250 unm.

Calcite is a naturally occurring mineral mined from the earth. The chemical formula is $CaCO_3$. The best calcite is mined in northern Mexico, where it was deposited by naturally occurring geothermal processes. However, most of the calcite mined is unsuitable for optical use, due to veils, inclusions, and other crystalline defects. Also, although the theoretical transmission of calcite extends roughly from 200 nm to 4000 nm, the practical absorption in the far infrared and near ultraviolet (in the mined crystal) is limited by the ionic impurities (such as Fe) which were present in the water in which the calcite grew. These problems inherent in mined calcite would be reduced by synthetic growth methods. Unfortunately, if calcite is directly heated at atmospheric pressure, it decomposes to CaO and $CO_2$ before it melts. (This is true of most carbonates.)

To grow calcite, it is necessary to duplicate the high pressure and temperature found in the earth. This entails growing calcite by a hydrothermal method. While hydrothermal methods are used extensively to grow quartz in industrial quantities, only experimental quantities of synthetically grown calcite are available. Industrial hydrothermal growth methods are much more expensive than low temperature melt growth methods, and calcite can not be grown by the standard low temperature melt growth methods. In addition, calcite grown using industrial hydrothermal methods contains microinclusions of water, degrading its performance in the infrared wavelength regime (due to optical absorption by the water inclusions) as well as in the ultraviolet spectral regime (due to scattering by the submicron water inclusions). Calcite remains, after more than a century, the principal material for Nicol prisms in the polarizing microscope. As natural stocks are depleted the need for growing synthetic $CaCO_3$ in large 1–2" minimum size boules becomes more urgent. Thus, a need exists for a replacement material for calcite as a polarization material.

SUMMARY OF THE INVENTION

It is an object of the present invention to provide several new optical polarizer materials.

It is also an object of the present invention to provide a method for making several new optical polarizer materials.

A number of highly birefringent crystals are identified. These crystals include $Li_2CO_3$, $LiNaCO_3$, $LiKCO_3$, $LiRbCO_3$ and $LiCsCO_3$. These crystals may be grown with standard crystal growth techniques. The condition of high birefringence leads to their application as optical polarizer materials. In one embodiment of the invention, the crystal has the chemical formula $LiK(1-w-x-y) Na(1-w-x-z)Rb(1-w-y-z)Cs(1-x-y-z)CO_3$, where $w+x+y+z=1$, and the molar fraction of Cs in the crystal is referred to as w, x refers to the molar fraction of Rb in the crystal, y refers to the molar fraction of Na in the crystal, and z refers to the molar fraction of K in the crystal. In another embodiment, the crystalline material may be selected from a an alkali metal carbonate and a double salt of alkali metal carbonates, where the polarizer has a Wollaston configuration, a Glan-Thompson configuration or a Glan-Taylor configuration.

A method of making an $LiNaCO_3$ optical polarizer is described. The steps include mixing anhydrous $Li_2CO_3$ and $Na_2CO_3$ to form a mixture having a molar ratio in the range of 1:1.2 to 1.2:1; heating the mixture in a crucible to near 510° C.; and producing a single crystal of the composition using standard single crystal growth techniques. A similar method is shown for making an $LiKCO_3$ optical polarizer.

BRIEF DESCRIPTION OF THE DRAWINGS

The single figure shows a polarizing prism employing a crystal of the present invention instead of calcite.

DETAILED DESCRIPTION OF THE INVENTION

Several crystals are disclosed which can act as suitable replacements for calcite in a polarizer. Examples include $Li_2CO_3$, $LiNaCO_3$ and $LiKCO_3$. Analogs of these materials exist where Rb and Cs take the place of K in the structure, resulting in the compounds $LiRbCO_3$ and $LiCsCO_3$. Other materials can obtained by exchanging a molar fraction of Na, K, Rb, or Cs in place of the equivalent molar fraction of the appropriate cation. The compound obtainable would be specified by the chemical formula $LiK_{(1-w-x-y)}Na_{(1-w-x-z)}Rb_{(1-w-y-z)}Cs_{(1-x-y-z)}CO_3$ where $w+x+y+z=1$. The molar fraction of Cs in the crystal is referred to as w, x refers to the molar fraction or Rb in the crystal, y refers to the molar fraction of Na in the crystal, and z refers to the molar fraction of K in the crystal. It is unlikely that the $NH_4$ cation needs to be included in a material description because $(NH_4)_2CO_3$ decomposes at approximately 400° C. lower than the above mentioned materials. $NH_4$ will also have the undesirable effect of absorbing in the near infrared region (1 mm–4 mm).

Of these materials $LiKCO_3$ and $LiNaCO_3$ are currently seen as the most desirable. It is a special material because it combines ease of growth, relatively large spectral transmission range, durability, and other favorable physical characteristics, as well as high birefringence, similar to that of calcite thus making it a suitable replacement for calcite as an optical polarizer material. Nitrates, for example, also have a high birefringence, but the absorption edge in nitrates occurs around 320 nmn, and thus nitrates have even less of a spectral transmittance range than calcite. Nitrates, in general, will also be more dispersive (the rate of change of the index of refraction with wavelength) than calcite. Nitrates are, however, fairly easy to grow from a water solution, a method which has previously yielded crystals of large aperture (KDP for example). Melt growth materials have an advantage over solution growth materials in that growth proceeds at rates of millimeters per hour versus millimeters per day. The best direct replacement for calcite would be a material with similar birefringence and dispersion, and one that is growable from a melt By considering materials which would have a similar birefringence, similar spectral transmission, similar hardness, and which are also low temperature melt-growth materials, it has been decided that another carbonate which is melt-growable would be an ideal replacement for calcite as a polarizer material. $Li_2CO_3$ is the only carbonate which does not decompose before it melts. However, the decomposition temperature of the other alkali metal carbonates (Na, K, Rb, and Cs) is only slightly above their melting points. When one material is mixed with another, the mixture always melts at a lower temperature than either of the two single component melting temperatures. Although the other alkali metal carbonates begin to decompose before they melt, by mixing these materials with $Li_2CO_3$, a new compound is formed which has a lower melting temperature than the decomposition temperature of the decomposing end member.

The $LiNaCO_3$ salt is formed by starting with anhydrous $Li_2CO_3$ and $Na_2CO_3$ within the molar ratio range of 1:1.2 to 1.2:1. The material is mechanically mixed and placed in a crucible which is heated to approximately 510° C., at which point the material melts. Standard melt growth techniques are then used to produce the desired $LiNaCO_3$ crystal. As the melt slowly cools, crystals of the new double salt ($LiNaCO_3$) will begin to grow. A similar procedure is used to produce $LiKCO_3$ except that as the starting material, $K_2CO_3$ is used in place of $Na_2CO_3$.

A typical application of the present invention is shown in the single figure where a material such as $Li_2CO_3$, $LiNaCO_3$, $LiKCO_3$, $LiRbCO_3$ or $LiCsCO_3$ is substituted for calcite in a polarizer 10 such as a Wollaston, Glan-Thompson or Glan-Taylor configuration. Unpolarized light 12 enters piece 14. Horizontally polarized light 16 exits the polarizer through exit window 18. Vertically polarized light 20 exits piece 22. The critical angle, a, is dependent upon the birefringence and indices of refraction of the material. Calcite has $n_o=1.65$ and $n_e=1.48$, (at a wavelength of the sodium doublet) leading to $a=26.33°$ from the expression: $a=90-\arcsin(n_e/n_o)$. In $LiNaCO_3$, $n_o \approx 1.538$, and $n_e \approx 1.406$. This leads to a determination of the angle a in the figures to be 23.91° in order for the beams to be reflected properly. Similar calculations may be done for Wollaston prisms, Glan-Thompson polarizing prisms, or Glan-Taylor polarizing prisms.

Changes and modifications in the specifically described embodiments can be carried out without departing from the scope of the invention, which is intended to be limited by the scope of the appended claims.

I claim:

1. An optical polarizer device comprising alkali metal carbonate crystal having a high birefringence.

2. The optical polarizer device of claim 1, wherein said crystal comprises $Li_2CO_3$.

3. The optical polarizer device of claim 1, wherein said crystal comprises $LiNaCO_3$.

4. The optical polarizer device of claim 1, wherein said crystal comprises $LiKCO_3$.

5. The optical polarizer device of claim 1, wherein said crystal comprises $LiRbCO_3$.

6. The optical polarizer device of claim 1, wherein said crystal comprises $LiCsCO_3$.

7. The optical polarizer device of claim 1, wherein said crystal comprises a compound having the chemical formula $LiK_{(1-w-x-y)}Na_{(1-w-x-z)}Rb_{(1-w-y-z)}Cs_{(1-x-y-z)}CO_3$ wherein $w+x+y+z=1$, wherein the molar fraction of Cs in said crystal is referred to as w, x refers to the molar fraction of Rb in said crystal, y refers to the molar fraction of Na in said crystal, and z refers to the molar fraction of K in said crystal.

8. An optical polarizer comprising crystalline material selected from a group consisting of an alkali metal carbonate and a double salt of alkali metal carbonates, wherein said polarizer has a configuration selected from a group consisting of a Wollaston configuration, a Glan-Thompson configuration and a Glan-Taylor configuration.

9. The optical polarizer of claim 8, wherein said alkali metal carbonate and said double salt of alkali metal carbonates are selected from a group consisting of $Li_2CO_3$, $LiNaCO_3$, $LiKCO_3$, $LiRbCO_3$ and $LiCsCO_3$.

10. The optical polarizer of claim 8, wherein said alkali metal carbonate or double salt of alkali metal carbonates comprises a compound having the chemical formula $LiK_{(1-w-x-y)}Na_{(1-w-x-z)}Rb_{(1-w-y-z)}Cs_{(1-x-y-z)}CO_3$ wherein $w+x+y+z=1$, wherein the molar fraction of Cs in said crystal is referred to as w, x refers to the molar fraction of Rb in said crystal, y refers to the molar fraction of Na in said crystal, and z refers to the molar fraction of K in said crystal.

* * * * *